(12) United States Patent
Nezakati et al.

(10) Patent No.: US 7,616,058 B1
(45) Date of Patent: Nov. 10, 2009

(54) RADIO FREQUENCY POWER COMBINING

(75) Inventors: Toktam Nezakati, Anaheim, CA (US);
Farbod Tabatabai, Anaheim, CA (US)

(73) Assignee: Raif Awaida, London (GB)

( * ) Notice: Subject to any disclaimer, the term of this patent is extended or adjusted under 35 U.S.C. 154(b) by 0 days.

(21) Appl. No.: 11/845,606

(22) Filed: Aug. 27, 2007

Related U.S. Application Data

(60) Provisional application No. 60/840,613, filed on Aug. 28, 2006.

(51) Int. Cl.
*H03F 3/68* (2006.01)

(52) U.S. Cl. ............... 330/124 R; 333/125; 333/33

(58) Field of Classification Search ............ 330/124 R; 333/100, 103, 106, 121, 126, 132, 12, 33, 333/125
See application file for complete search history.

(56) References Cited

U.S. PATENT DOCUMENTS

| | | | |
|---|---|---|---|
| 2,698,381 A | 12/1954 | Robertson-Shersby-Harvie | |
| 2,847,517 A | 8/1958 | Small | |
| 2,874,276 A | 2/1959 | Dukes et al. | |
| 3,091,743 A | 5/1963 | Wilkinson | |
| 3,775,694 A * | 11/1973 | Quine | 330/56 |
| 3,953,702 A * | 4/1976 | Bickel | 219/761 |
| 4,097,708 A * | 6/1978 | Bickel | 219/761 |
| 4,182,996 A * | 1/1980 | Spence | 333/100 |
| 4,316,160 A | 2/1982 | Dydyk | |
| 4,367,445 A | 1/1983 | Dydyk | |
| 4,562,409 A * | 12/1985 | Saito et al. | 330/286 |
| 4,590,446 A * | 5/1986 | Hsu et al. | 333/125 |
| 4,641,107 A * | 2/1987 | Kalokitis | 330/286 |
| 4,876,744 A | 10/1989 | Endo et al. | |
| 4,933,651 A * | 6/1990 | Benahim et al. | 333/125 |
| 5,128,628 A * | 7/1992 | Marks et al. | 330/66 |
| 5,754,082 A * | 5/1998 | Swanson | 333/124 |
| 5,966,059 A * | 10/1999 | Sigmon | 333/128 |
| 6,037,840 A * | 3/2000 | Myer | 330/295 |
| 6,242,984 B1 * | 6/2001 | Stones et al. | 330/295 |
| 6,344,777 B1 * | 2/2002 | Ingram et al. | 330/295 |
| 6,587,013 B1 * | 7/2003 | Arlin et al. | 333/101 |
| 6,650,200 B2 * | 11/2003 | Culliton et al. | 333/124 |
| 6,982,613 B2 * | 1/2006 | Wu et al. | 333/137 |
| 7,113,056 B2 * | 9/2006 | Wu et al. | 333/137 |
| 7,312,673 B2 * | 12/2007 | Wu et al. | 333/137 |
| 7,466,203 B2 * | 12/2008 | Rector | 330/295 |

* cited by examiner

*Primary Examiner*—Patricia Nguyen
(74) *Attorney, Agent, or Firm*—Knobbe Martens Olson & Bear LLP (57) ABSTRACT

Systems and methods for combining RF signals are disclosed. An input signal can be divided into equal parts going around a ring clockwise and counterclockwise. In one embodiment, the RF amplifiers are arranged on the inside of a ring structure, and output is combined approximately at the center of the ring.

13 Claims, 7 Drawing Sheets

RADIO FREQUENCY POWER COMBINING

CROSS-REFERENCE TO RELATED APPLICATIONS

This application claims the benefit under 35 U.S.C. § 119(e) of U.S. Provisional Application No. 60/840,613, filed Aug. 28, 2006, the entirety of which is hereby incorporated by reference.

BACKGROUND OF THE INVENTION

1. Field of the Invention

The invention relates to power combining, and in particular, to RF power combining.

2. Description of the Related Art

It is often desirable to combine the output power of more than one RF amplifier. For example, the output power requirements for a particular system may be higher than practical from a cost, packaging, or efficiency point of view. For example, relatively low voltage RF devices can typically operate relatively efficiently at RF speeds, but this can limit the available power from a single RF device. Accordingly, there can be a need to combine the output power of multiple RF amplifiers.

Combining power at radio frequencies is not a simple task. At radio frequencies, impedance mismatches can result in reflections, which can cause an uneven frequency response of the system, which is typically undesirable.

Typically, a structure for a power splitter can also be used for a power combiner and vice versa. Examples of structures include resistive combiners, rat-race couplers, Wilkinson power splitters, and magic tees.

Examples of prior techniques for combining can be found in U.S. Pat. Nos. 2,698,381 to Robertson-Shersby-Harvie; 2,847,517 to Small; 2,874,276 to Dukes et al.; 3,091,743 to Wilkinson; 4,316,160 to Dydyk; and 4,367,445 to Dydyk. Other related information can be found in the following: David M. Pozar, "Microwave Engineering," Third Edition, 2005; T. C. Edwards, "Foundations for Microstrip Circuit Design," 1981; and Andrei Grebennikov, "RF and Microwave Power Amplifier Design," 2005.

SUMMARY OF THE INVENTION

Combination of RF signals permits relatively small RF power amplifiers to generate relatively large amounts of power. This can be useful in compact designs, for reliability, for modularity, and the like. In one embodiment, the RF amplifiers are arranged on the inside of a ring structure, and output is combined approximately at the center of the ring.

One embodiment of the invention is an apparatus for amplifying a radio frequency (RF) signal, wherein the apparatus includes: a ring structure configured to distribute one or more input signals, the ring structure having a circumference; two or more RF amplifiers having inputs coupled to an interior of the ring structure; and a power combining circuit located interior to the ring structure, the power combining circuit coupled to outputs of the two or more RF amplifiers, the power combining circuit configured to combine the outputs of the two or more RF amplifiers.

BRIEF DESCRIPTION OF THE DRAWINGS

These drawings (not to scale) and the associated description herein are provided to illustrate specific embodiments of the invention and are not intended to be limiting.

DETAILED DESCRIPTION OF THE PREFERRED EMBODIMENT

There are applications, such as in base stations, wireless routers, wireless access points, and the like for WiFi hotspots or for other wireless base stations, such as cell phone base stations, WiMax, and the like, wherein the RF output power requirements are relatively high.

It can be desirable to combine the output power of two or more amplifiers. For example, combining the output power of multiple RF amplifiers can lead to a more robust system that is less susceptible to single point failures, such as a single point failure of a relatively high power amplifier. In another example, the combining of output power of multiple RF amplifiers is useful to be able to provide a modular amplifier system with a relatively easily configurable output power by varying the number of amplifiers combined.

Figure 1A:
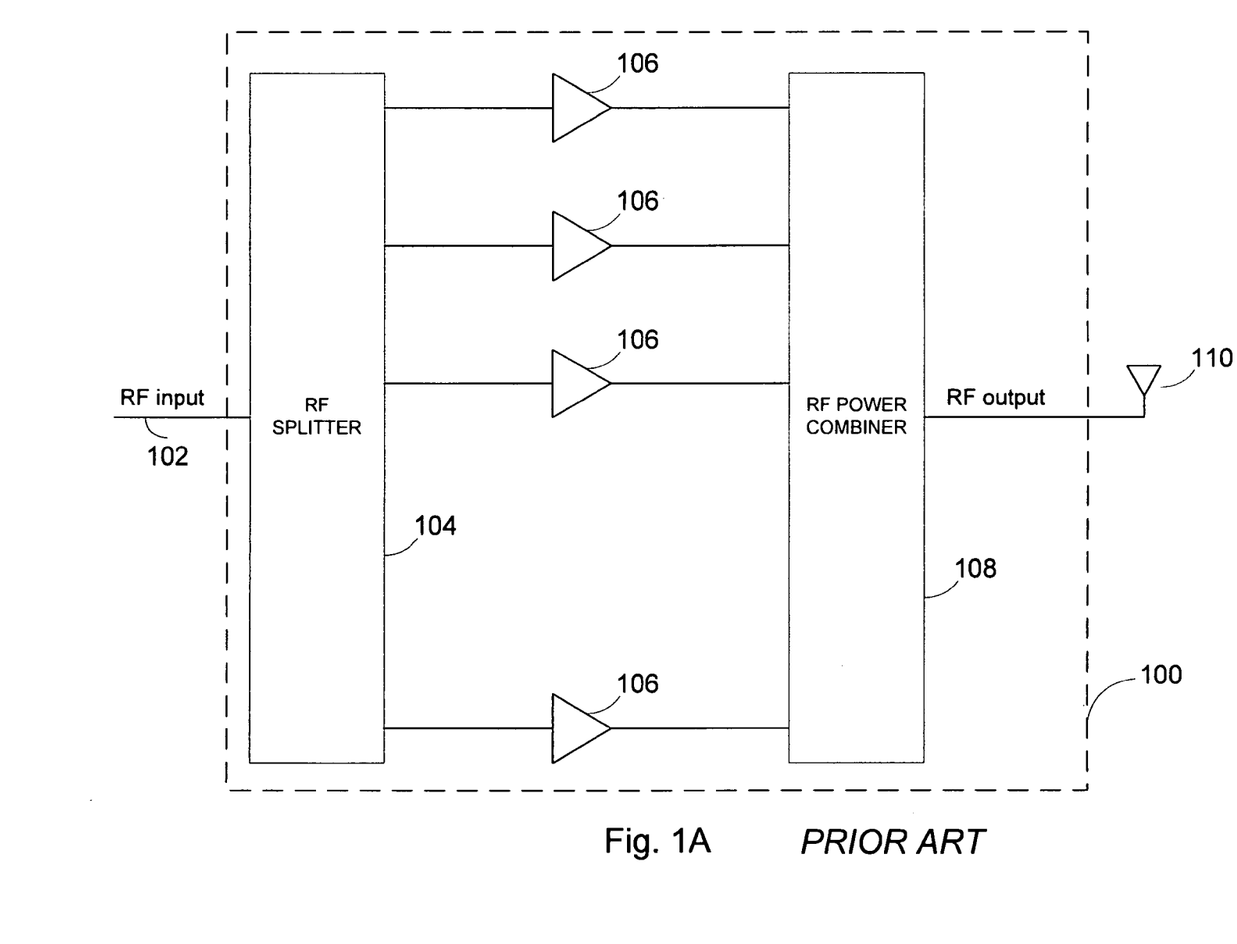
FIG. 1A illustrates an overview of an RF power amplifier system including an RF splitter, a plurality of RF amplifiers, and an RF power combiner.

FIG. 1A illustrates an overview of an RF power amplifier system 100 including an RF splitter 104, a plurality of RF amplifiers 106, and an RF power combiner 108. An RF input 102 receives the RF signal to be amplified. The RF signal can be provided by, for example, a modulator.

Figure 3:
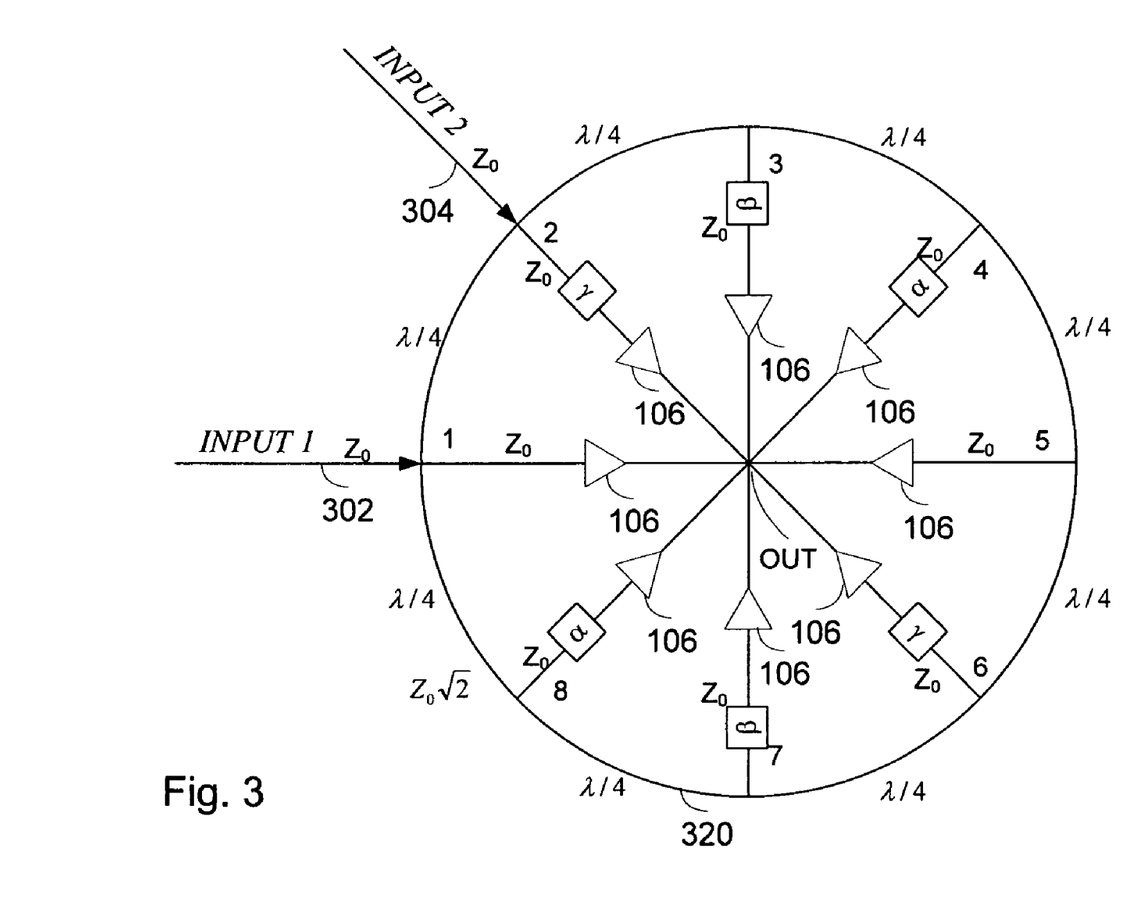
FIG. 3 illustrates an RF splitter with a ring structure having a separation between each branch of a quarter wavelength ($\lambda/4$).
Figure 4:
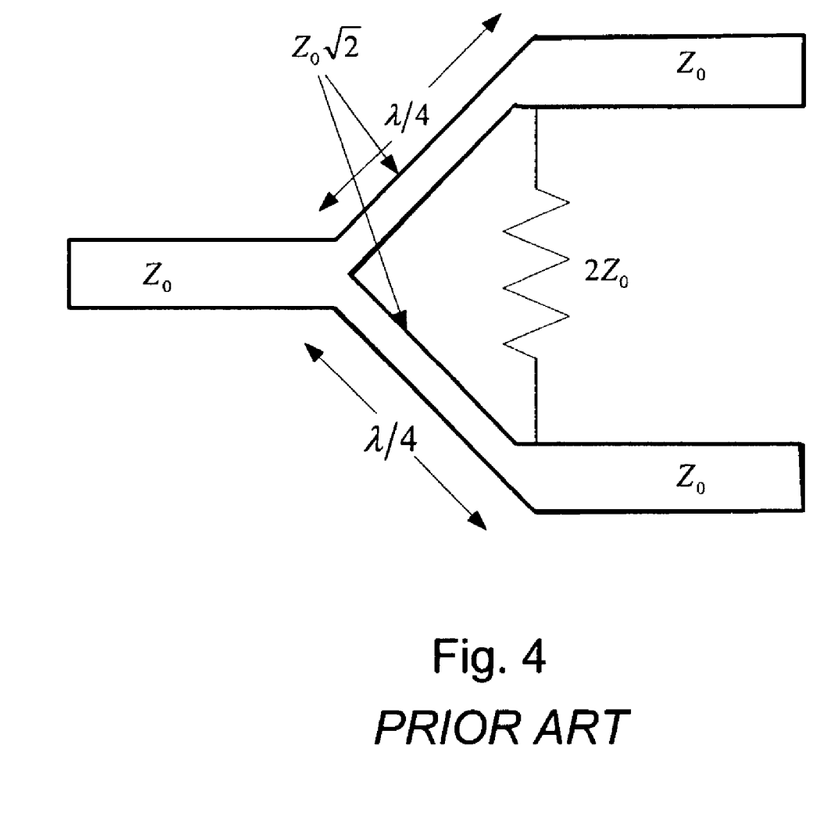
FIG. 4 illustrates an example of a 2-way Wilkinson divider/combiner.
Figure 5:
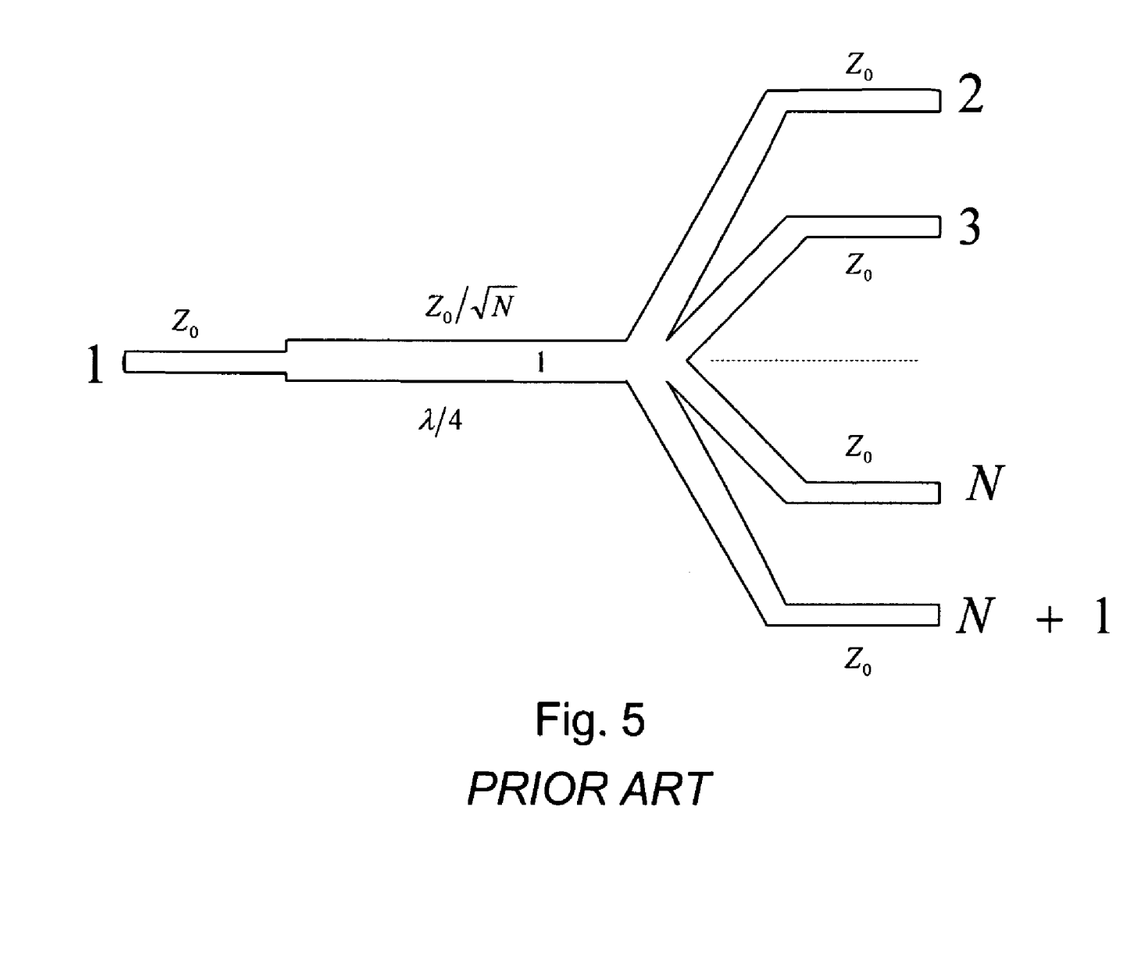
FIG. 5 illustrates an example of an N-way Wilkinson divider/combiner.
Figure 6:
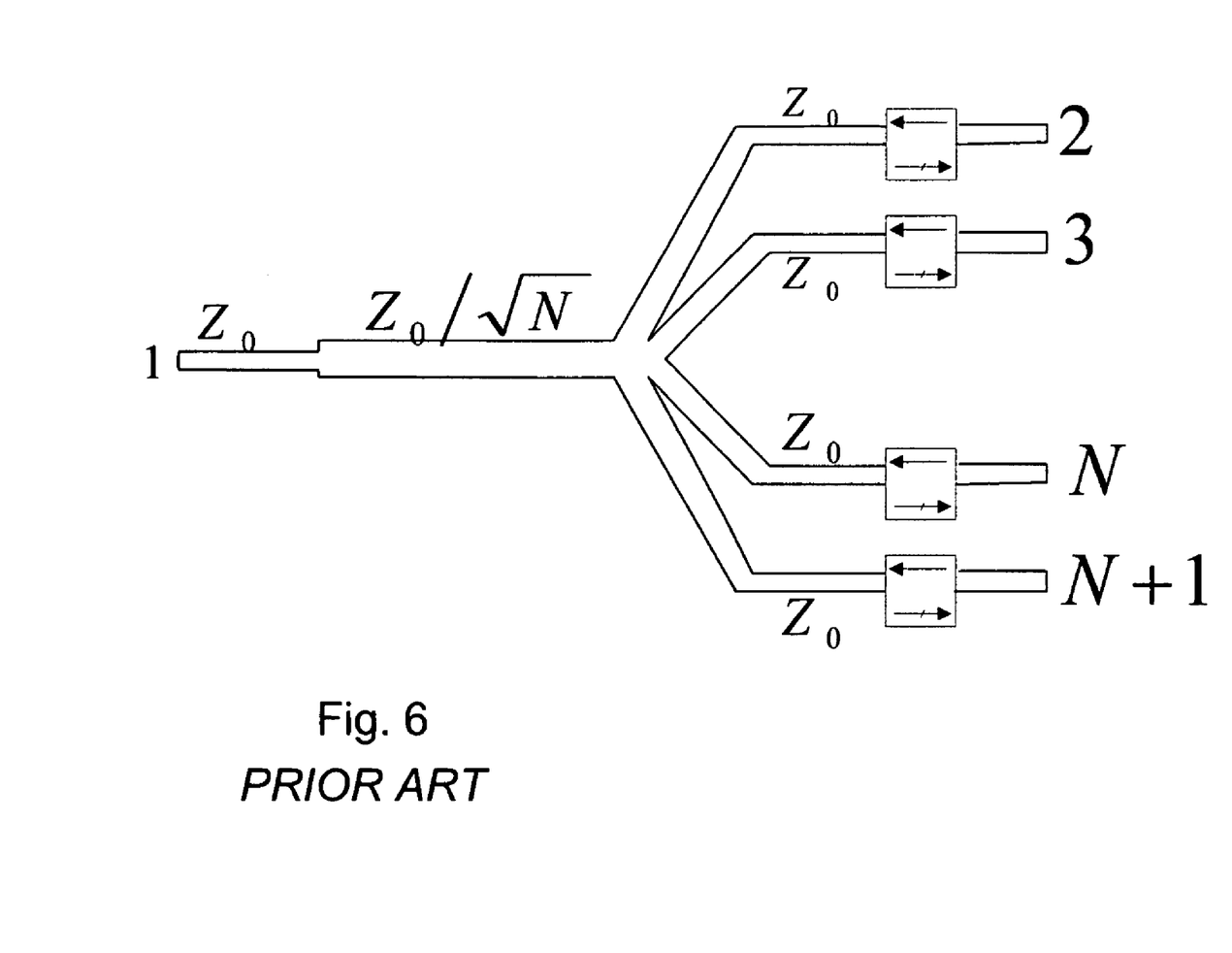
FIG. 6 illustrates an example of an N-way Wilkinson divider/combiner showing optional isolators.

The RF splitter 104 divides or splits the RF signal to the plurality of RF amplifiers 106. Examples of arrangements of RF splitters 104 and RF amplifiers 106 will be described in greater detail later in connection with FIGS. 1B, 2, and 3. The RF power combiner 108 combines the outputs of the RF amplifiers 106. FIGS. 4-6 illustrate examples based on a Wilkinson power splitter/combiner. However, other RF power combining techniques are applicable and will be readily determined by one of ordinary skill in the art. The RF output can provided to, for example, an antenna 110 for transmission.

Descriptions of Ring Structures

Figure 1B:
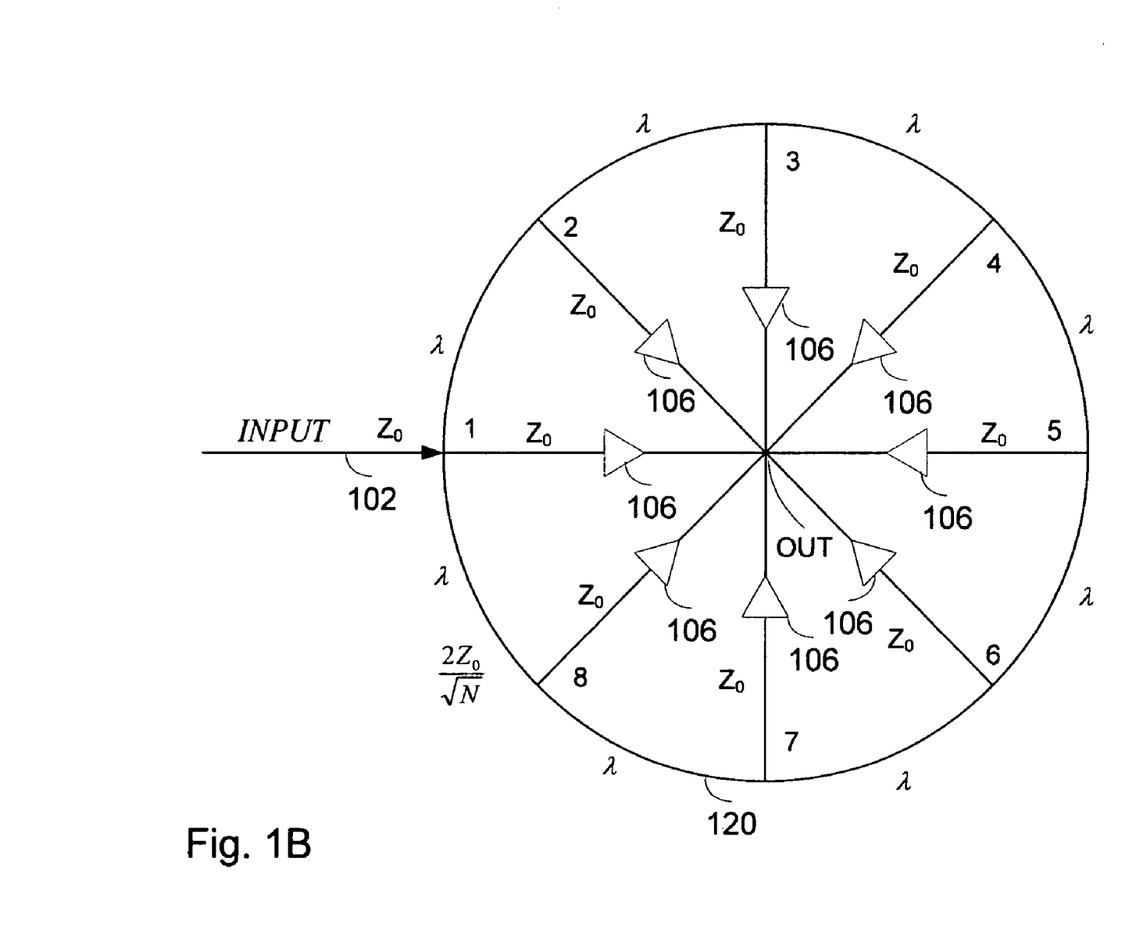
FIG. 1B illustrates an RF splitter with a ring structure having a separation between each branch of an integer multiple of wavelengths ($\lambda$).

The disclosed ring structure devices can be used as a signal combiner or as a power splitter. The embodiments can be thought of as a form of a "rat race" coupler. One embodiment is illustrated in FIG. 1B. An RF signal is provided to the input 102. This signal divides into two equal parts going around the ring 120 clockwise and counterclockwise. Using analysis analogous with those used of the rat race, the signals add at the ports 1, 2, 3, 4, 5, 6, 7 and 8 providing equal signals at each port. Thus, the ring structure 120 acts as an eight-way power splitter. It will be understood that rather than 8-way, in general a N-way splitter will be apparent from the illustrated configuration.

The output RF power is collected at the center of the illustrated schematic. The output power depends on the branches and the output of each of the amplifiers 106. The loop can be implemented by one input port (FIGS. 1B, 2) or with two input ports (FIG. 3) as will be described in greater detail later. Equation (1) described later in connection with Wilkinson structures expresses the characteristic impedances of the ring structure between any two given ports coupled thereto. As observed from this equation, a ring structure 120, 220, 320 inherently has impedance transformation characteristics to match the ring structure 120, 220, 320 to the external loads. In one embodiment illustrated in FIG. 3, quarter wavelength coupled, power Wilkinson divider and multiple branch combiners are used.

Figure 2:
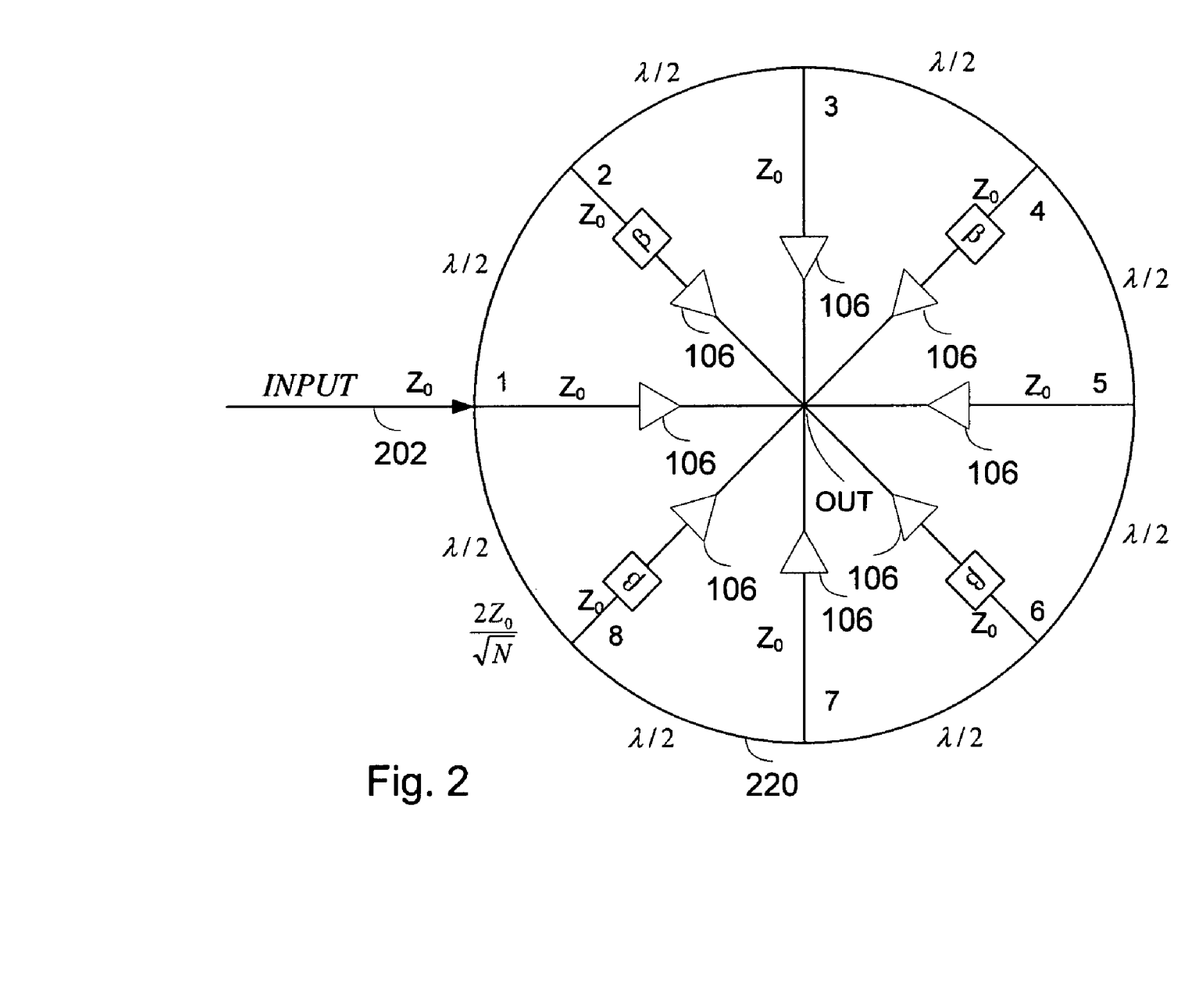
FIG. 2 illustrates an RF splitter with a ring structure having a separation between each branch of a half wavelength ($\lambda/2$).

Three different techniques to implement power combining will be described. The techniques vary depending on the branch separation within the ring structure 120, 220, 320. FIGS. 1B, 2, and 3 illustrate single wavelength ($\lambda$) long branches, half wavelength ($\lambda/2$) long branches, and quarter wavelength ($\lambda/4$) long branches. The ring structures can be implemented by, for example, microstrip. In the illustrated embodiment, N relates to the number of branches. The characteristic impedance $Z_0$ can be, for example, 50 ohms.

FIG. 1B illustrates an RF splitter in a ring structure 120 having a separation between each branch of an integer multiple of wavelengths ($\lambda$). The ring circumference can be counted by multiplication of the number of branches and the wavelength ($\lambda=360°$). However, it will be understood that the branches can be spaced apart at further intervals of wavelengths, which will result in a larger structure. In the illustrated embodiment with 8 ports, about ⅛ of the main signal appears at each port. The illustrated structure splits the input port 102 to 8 ports (1:8). The output of the ring structure 120 is a combination of all branches of the ring. The structure illustrated in FIG. 1B is applicable to any numbers of branches from 2 ports and above, and to both odd and even numbers of ports.

The input port 102 has a characteristic impedance of $Z_0$. Each branch of the (illustrated as arcs along the circumference of the ring structure 120) is one wavelength long or integer multiple thereof, and has a characteristic impedance of $$\frac{2Z_0}{\sqrt{N}}$$

ohms. The lines from the branch to the inputs of the RF amplifiers 106 have a characteristic impedance of $Z_0$. In the illustrated embodiment, the RF output is taken from the center as shown. Wilkinson divider/splitters can be used as will be described later in connection with FIGS. 4, 5, and 6.

An explanation of operation of each port follows. Port 1 has ⅛ amount of the main signal as the output of the ring to the input of the corresponding power amplifier for port 1.

The same amount of the main signal will appear at the input to the amplifier for port 2. This occurs because as the main signal passes through the input port and as is provided to the ring, the signal propagates through $7\lambda(14\pi=2\pi)$ of branches anticlockwise and one $\lambda(2\pi)$ branch clockwise. These signals sum as the wavelengths maintain the RF signal in phase.

Port 3 has ⅛ amount of the main signal at the output port (input of the amplifier for port 3). From input of main signal to port three, the electrical lengths are $6\lambda(12\pi=2\pi)$ anticlockwise and $2\lambda(4\pi=2\pi)$ clockwise.

Port 4 provides same amount of output to the corresponding amplifier. Port 4 has branch propagations of $5\lambda(10\pi=2\pi)$ anticlockwise and $3\lambda(6\pi=2\pi)$ clockwise from input to port 4.

Port 5 provides the same output signal to the corresponding amplifier and the difference is $4\lambda(8\pi=2\pi)$ anticlockwise and $4\lambda(8\pi=2\pi)$ clockwise in electrical length. Ports 6, 7, and 8 are symmetric with ports 4, 3, and 2, respectively.

FIG. 2 illustrates an RF splitter with a ring structure 220 having a separation between each branch of a half wavelength ($\lambda/2$). The circuit illustrated in FIG. 2 can be more compact than the circuit illustrated in FIG. 1. In this technique, the separation between branches can be a half wavelength $\lambda/2$ (or an integer multiple plus half a wavelength). Phase shifters $\beta$ realign the proper phase relationships for constructive interference. In the illustrated embodiment, the electrical circumference of the ring is 4 times the wavelength. The separation between each port is 180° ($\lambda/2=360/2=180$ degrees). The amount of the signal of each port from the main signal is equal as the previous method (⅛ of the main signal). The output of each branch is combined at the center of the ring.

The operation is described as follows. Port 1 provides ⅛ of the main signal as an input 202 for the corresponding amplifier for port 1. The same amount of the signal will be appear at the input of the amplifier for port 2. The main signal passes through the input port 202 and as the main signal is provided to the ring, branch propagation of $7\lambda/2$ $$\left(\frac{14\pi}{2}=7\pi=\pi\right)$$

anticlockwise and branch propagation of $$\lambda/2\left(\frac{2\pi}{2}=\pi\right)$$

clockwise are encountered. These two lengths are the proper length for in phase combination. However, port 2 has a $$\lambda/2\left(\frac{2\pi}{2}=\pi\right)$$

phase shift with respect to port 1. To compensate for the phase shift, a phase shifter $\beta$ with a $$\lambda/2\left(\frac{2\pi}{2}=\pi\right)$$

phase shift is provided in port 2 in the signal path before the RF amplifier 106. For example, the phase shifter $\beta$ can be half a wavelength long microstrip line.

Port 3 provides ⅛ amount of the main signal at an input of the amplifier coupled to port 3. From input of the main signal to port 3, the electrical lengths correspond to $$6\lambda/2\left(\frac{12\pi}{2}=6\pi=2\pi\right)$$

anticlockwise and $$2\lambda/2\left(\frac{4\pi}{2} = 2\pi\right)$$

clockwise. Port 3 is in phase with respect to the port 1.

Port 4 has branch propagations of $$5\lambda/2\left(\frac{10\pi}{2} = 5\pi = \pi\right)$$

anticlockwise $$3\lambda/2\left(\frac{6\pi}{2} = 3\pi = \pi\right)$$

and clockwise from the input 202 to port 4. Similar to port 2, port 4 has the $$\lambda/2\left(\frac{2\pi}{2} = \pi\right)$$

phase shift with respect to ports 1 and 3. To compensate for the phase shift, it is necessary a phase shifter β having $$\lambda/2\left(\frac{2\pi}{2} = \pi\right)$$

phase shift is used in port 4 signal path before the RF amplifier 106.

Port 5 has branch propagations of $$4\lambda/2 = \left(\frac{8\pi}{2} = 4\pi = 2\pi\right)$$

anticlockwise phase shift and $$4\lambda/2\left(\frac{8\pi}{2} = 4\pi = 2\pi\right)$$

clockwise due to electrical length. Port numbers 8 and 6 are symmetric with ports 2 and 4, respectively. Port 7 is symmetric with port 3.

FIG. 3 illustrates an RF splitter with a ring structure 320 having a separation between each branch of a quarter wavelength (λ/4). Two inputs 302, 304 are illustrated. A signal is applied to the input port 1 302 and another signal with the same amplitude and 90 degree phase shift applies to the input port 2 304. The signal introduced from the input port 1 302 has an output that is in phase at ports 1, 3, 5, and 7. At other ports, the signal will be at least partially out of phase. For the signal introduced into input port 2 304, the outputs at ports 2, 4, 6, and 8 will be in-phase, and will be at least partially out of phase in the other ports. The technique described earlier in connection with FIG. 2 for phase shifting with half a wavelength is applicable ports 3 and 7, which are at a λ/2 phase shift with respect to ports 1 and 5. These phase shifters are indicated by β. Quarter wavelength phase shifters or ¾ wavelength phase shifters are applicable at other ports, as represented by α, and γ, respectively.

Operation is described as follows. The electrical circumference of the ring structure 320 is 8λ/4 and each port is separated by 90° (λ/4=360/4=90). ¼ of the input signals will appears at each port. The center of the ring is the combination from all branches after amplification and phase shifting, as applicable, and is provided as the output.

There are various ways to have two inputs with same amplitude. For example it is possible to inject the main signal to the microstrip power Wilkinson divider, an embodiment of which is illustrated in FIG. 4. The impedance of each branch is $Z_0\sqrt{2}$ with the length of λ/4 and the isolation of $2Z_0$.

In the foregoing embodiments illustrated in connection with FIGS. 1B, 2, and 3, the RF amplification is performed by the RF amplifiers 106, and is tapped from the center of the ring. The RF amplifiers 106 can be, for example, monolithic microwave integrated circuits (MMIC), radio frequency integrated circuits (RFIC), and the like.

FIG. 4 illustrates an example of a 2-way Wilkinson divider/combiner. For example, it is possible to introduce an input signal to a microstrip Wilkinson power divider, an example of which is shown in FIG. 4. The impedance of each branch is $Z_0\sqrt{2}$ with the length of λ/4 and the isolation of $2Z_0$.

FIG. 5 illustrates an example of an N-way Wilkinson divider/combiner. For splitting, flow is from left to right as shown in FIG. 4. For combining, flow is from right to left. FIG. 6 illustrates an example of an N-way Wilkinson divider/combiner showing optional isolators. The isolators can correspond to ferrite isolators, which can be implemented as circulators with a loaded third port. The isolators prevent reflected waves from impedance mismatches from returning upstream to the outputs of RF amplifiers.

After the amplification in each branch, the signals are combined together (as indicated at the center of each structure in FIGS. 1, 2, and 3). This combinations work as a parallel signal N-way combiner which provides a combination of power N transmission lines. There are typically a total of N+1 ports in an N-way combiner with N input ports and one output port. In the illustrated examples, 8 lines are combined with characteristic impedance of $Z_0$=50 ohms (each connected in parallel and equal to $Z_0$/N) is converted by a quarter wave transformer. This N-way combiner as illustrated in FIG. 5 typically does not provide sufficient isolation between inputs. The input impedances are matched only when all input signals have the same magnitudes and phases at any combiner input.

One technique to provide full isolation between the inputs and outputs of the combiner is to use ferrite isolators at the inputs. These isolators can be placed in the data flow of the output of the RF amplifiers.

For calculating the characteristic impedance of the transformer line, Equation 1 applies as expressed below:

$$Z_{TL}=\sqrt{Z_1 Z_2} \qquad (1)$$

In Equation 1, $Z_{TL}$ is the impedance of the transformer line between $Z_1$ and $Z_2$.

In one embodiment, the ring has a circular shape having a circumference that is an integer multiple of wavelengths for the intended operating frequency. Ports along the circumference can be spaced at integer multiples of full wavelengths (e.g., FIG. 1A), integer multiples of half wavelengths (e.g., FIG. 2), integer multiples of quarter wavelengths (e.g., FIG.

3), or combinations thereof. Ports spaced at arc lengths other than integer multiples of full wavelengths by utilizing phase shifters as illustrated in FIG. 2 and FIG. 3 such that the signals from the various paths are in-phase with respect to each other for constructive interference when combined. These phase shifters can be placed between the ring and an amplifier, between the amplifier and a combining circuit, or a combination of both. In one embodiment, the center of a circle defining the ring is the combination point.

Various embodiments have been described above. Although described with reference to these specific embodiments, the descriptions are intended to be illustrative and are not intended to be limiting. Various modifications and applications may occur to those skilled in the art.

What is claimed is:

1. An apparatus for amplifying a radio frequency (RF) signal, the apparatus comprising:
    a ring structure configured to distribute one or more input signals such that the one or more input signals are divided into equal parts going around the ring structure clockwise and counterclockwise;
    two or more RF amplifiers having inputs coupled to an interior of the ring structure; and
    a power combining circuit located interior to the ring structure, the power combining circuit coupled to outputs of the two or more RF amplifiers, the power combining circuit configured to combine the outputs of the two or more RF amplifiers.

2. The apparatus of claim 1, wherein the ring structure further comprises one or more input ports configured to couple the one or more input signals to the ring structure from outside the circumference of the ring structure.

3. The apparatus of claim 1, wherein the ring structure is implemented with microstrip.

4. The apparatus of claim 1, wherein each of the two or more RF amplifiers is physically located within an interior of the circumference of the ring structure.

5. The apparatus of claim 1, further comprising a phase shifter in a signal path between the ring structure and an RF amplifier of the two or more RF amplifiers.

6. The apparatus of claim 1, further comprising an isolator in a signal path between an RF amplifier of the two or more RF amplifiers and the power combining circuit.

7. The apparatus of claim 1, wherein the power combining circuit comprises a Wilkinson power combiner.

8. The apparatus of claim 1, wherein the power combining circuit is configured to generate an output approximately in a center of the ring structure.

9. The apparatus of claim 1, the ring structure having a circumference of an integer multiple of full wavelengths of the one or more input signals.

10. The apparatus of claim 1, wherein an arc length between ports is an integer multiple of full wavelengths.

11. The apparatus of claim 1, wherein an arc length between ports of the ring structure is an integer multiple of half wavelengths, further comprising at least one phase shifter in a signal path between the ring structure and the power combining circuit to align signals to be combined.

12. The apparatus of claim 1, wherein an arc length between ports of the ring structure is an integer multiple of quarter wavelengths, further comprising at least one phase shifter in a signal path between the ring structure and the power combining circuit to align signals to be combined.

13. The apparatus of claim 1, wherein an arc length between ports of the ring structure is an integer multiple of quarter wavelengths, further comprising phase shifters in signal paths between the ring structure and the power combining circuit for ¾ wavelength, ½ wavelength, and ¼ wavelength for phase alignment.

* * * * *